US00RE34106E

United States Patent [19]

Ohmi

[11] E Patent Number: Re. 34,106

[45] Reissued Date of Patent: Oct. 20, 1992

[54] SEMICONDUCTOR MANUFACTURING APPARATUS

[76] Inventor: Tadahiro Ohmi, 1-17-301, Komegabukuro 2-chome, Sendai-shi, Miyagi-ken 980, Japan

[21] Appl. No.: 690,541

[22] Filed: Apr. 23, 1991

Related U.S. Patent Documents

Reissue of:

[64] Patent No.: 4,824,546
Issued: Apr. 25, 1989
Appl. No.: 85,157
Filed: Aug. 14, 1987

[30] Foreign Application Priority Data

Aug. 20, 1986 [JP] Japan ..... 61-194151

[51] Int. Cl.[5] ..... C23C 14/34

[52] U.S. Cl. ..... 204/298.08; 204/298.06; 204/192.12; 204/192.3

[58] Field of Search ..... 204/192.12, 192.3, 298.08, 204/298.06, 298.16, 298.19

[56] References Cited

U.S. PATENT DOCUMENTS 3,704,219 11/1972 McDowell ..... 204/192
4,525,262 6/1985 Class et al. ..... 204/192
4,579,618 4/1986 Celestino et al. ..... 156/345

OTHER PUBLICATIONS

J. L. Vossen and J. J. O'Neill, Jr. Ultra Stable System for RF Sputtering With RF-Induced Substrate Bias.
H. Norstrom Experimental And Design Information For Calculating Impedance Matching Networks For Use In RF Sputtering And Plasma Chemistry.

*Primary Examiner*—Nam Nguyen
*Attorney, Agent, or Firm*—Baker & Daniels

[57] ABSTRACT

A semiconductor manufacturing for depositing an insulating thin film on a surface of a semiconductor substrate in a vacuum vessel at an atmosphere of reduced pressure, wherein radiofrequency powers each having different first and second radiofrequencies are applied respectively to a target electrode composed of a material for an insulating thin film and a succeptor electrode for holding said semiconductor substrate. The first frequency is selected to be lower than said second frequency, whereby a high quality insulating film having a surface excellent in flatness can be assured without damaging the substrate.

13 Claims, 5 Drawing Sheets

SEMICONDUCTOR MANUFACTURING APPARATUS

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to a semiconductor manufacturing apparatus, and more particularly to a bias sputtering apparatus for depositing an insulating thin film on a substrate.

2. Discussion of Background

Presently, a sputtering method is widely employed for formation of wiring materials and insulating thin films for use in integrated circuits. Such a sputtering method makes a thin film by introducing Ar gas into a vacuum vessel and applying direct current or radiofrequency power to a cathode including a target material mounted thereon to cause glow discharge. As a result of this glow discharge, a target surface is negatively biased (called a self bias) with respect to the plasma, and Ar ions accelerated by this bias voltage collide with the target surface to subject the target material to sputtering and etching. Material particles so etched are deposited on a wafer located in opposition to the target for film making. In contrast, there is known the so called radiofrequency bias sputtering process wherein radiofrequency power is applied to a succeptor itself including the wafer mounted thereon as well as target to deposit a film on the wafer surface, while sputtering and etching are effected by the self bias formed on the wafer surface simultaneously with the film deposition on the wafer surface.

FIG. 5 is a schematic cross-sectional view of a typical conventional bias sputtering apparatus. Designated at 501 is a target composed of a material such as $SiO_2$, $Si_3N_4$, $Al_2O_3$, AlN and the like for example, and 502 designates a target electrode including the target mounted thereon. Moreover, designated at 503 and 504 are respectively a semiconductor wafer and a succeptor electrode. Radiofrequency power is supplied to the target electrode 502 and the succeptor electrode 504 via a matching circuit, and a vacuum vessel 505 is grounded. For this application, a radiofrequency (RF) power source having an oscillation frequency of 13.56 MHz is typically employed. Moreover, for an actual apparatus, besides those members described above, a vacuum exhaust unit, a gas introduction inlet, and a mechanism for taking the wafer into and out of the apparatus are provided, but are not shown in the figure for the sake of brevity.

The surfaces of the semiconductor wafer 503 and the succeptor 504 are negatively biased with respect to the plasma by the RF power applied to the succeptor, with which the Ar ions accelerated by an electric field caused by the self bias collide to permit the deposited film to be partly resputtered. Such a radiofrequency bias sputtering method assures a thin film excellent in mechanical strength. In addition, this radiofrequency bias sputtering method also enables a flat surface film to be formed by making use of a property of the film, that film formed at a stepped portion is likely to be sputtered. This method however suffers from a severe problem during manufacturing a semiconductor integrated circuit in that the substrate of the semiconductor wafer is damaged due to the collision of the Ar ions accelerated by the self bias with the semiconductor wafer resulting in deteriorated characteristics of the constituent elements. These problems hinder the bias sputtering apparatus from being put into practical use.

SUMMARY OF THE INVENTION

In view of the drawbacks of the prior techniques, it is an object of the present invention to provide a semiconductor manufacturing apparatus capable of forming a high quality insulating thin film without damaging an underlying substrate.

The above object, and other objects, are achieved according to the present invention by providing a bias sputtering apparatus for depositing an insulating thin film on the surface of a semiconductor substrate in an atmosphere of reduced pressure, including a target composed of a material for the insulating thin film or of at least one of constituent elements of the material for the insulating thin film, a target electrode provided mounted on and adjoining the target for applying first radiofrequency power of a first frequency to the target, a first radiofrequency power source for generating the first radiofrequency power of the first frequency to supply that power to the target electrode, a first matching circuit provided between the target electrode and the first radiofrequency power source for matching the target electrode to the first radiofrequency power source, a band reject filter disposed between the matching circuit and the target electrode for selectively permitting only the first radiofrequency signal to be transmitted to the target electrode, a semiconductor substrate disposed spaced away from the target in a confronting relation therewith for permitting the insulating film of the target to be deposited thereon as a result of sputtering, a succeptor electrode for supporting the semiconductor substrate thereon, a second radiofrequency power source for generating second radiofrequency power of a second frequency to the succeptor thereby to permit a self bias to be applied to the surfaces of the semiconductor wafer and the succeptor for thereby resputtering the deposited film in part, the self bias being negative in potential with respect to the plasma, a second matching circuit disposed between the succeptor electrode and the second radiofrequency power source for matching the succeptor electrode to the second radiofrequency power source, a second band eliminator disposed between the succeptor electrode and the matching circuit for selectively permitting the second radiofrequency signal to be transmitted to the succeptor electrode, and a vacuum vessel for enclosing the target electrode, target, semiconductor substrate, and succeptor, the first frequency being selected to be lower than the second frequency.

BRIEF DESCRIPTION OF THE DRAWINGS

A more complete appreciation of the invention and many of the attendant advantages thereof will be readily obtained as the same becomes better understood by reference to the followed detailed description when considered in connection with the accompanying drawings, wherein.

DESCRIPTION OF THE PREFERRED EMBODIMENTS

Figure 1A:
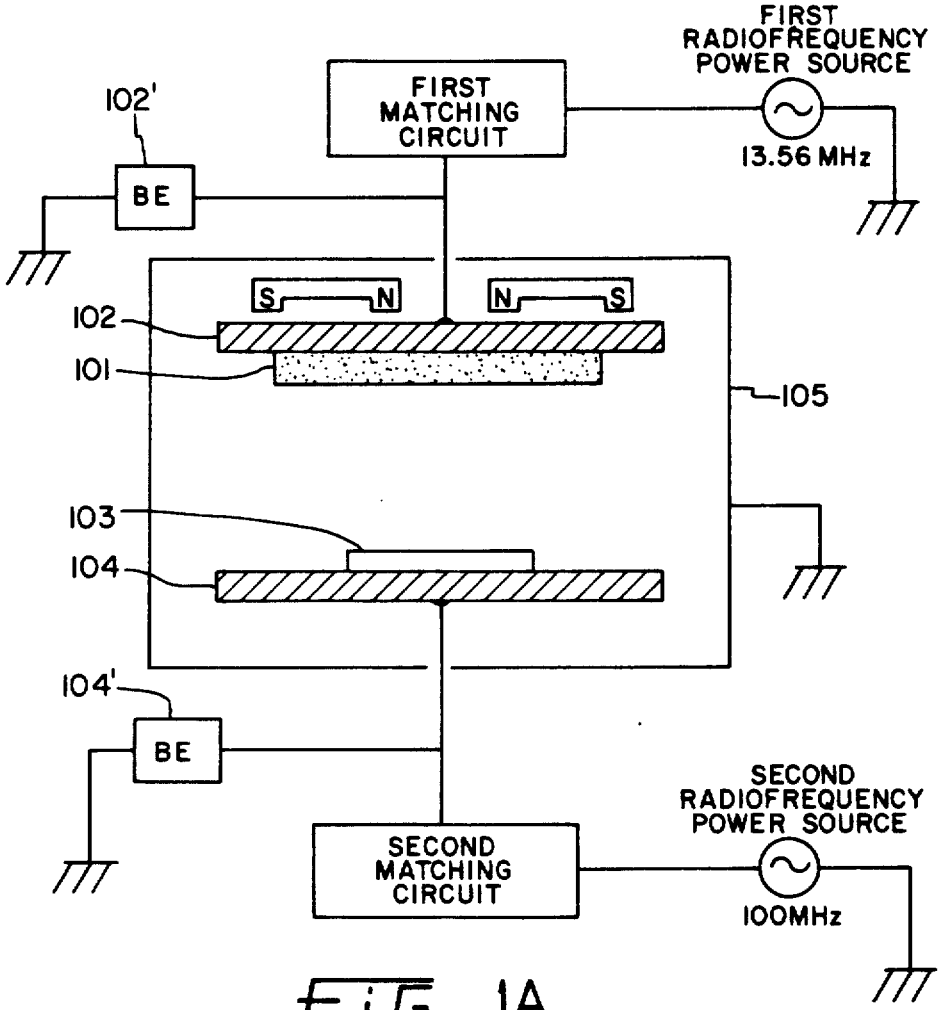
FIGS. 1(a), (b) and (d) are schematic diagrams respectively illustrating a first embodiment of a semiconductor manufacturing apparatus according to the present invention.
Figure 5:
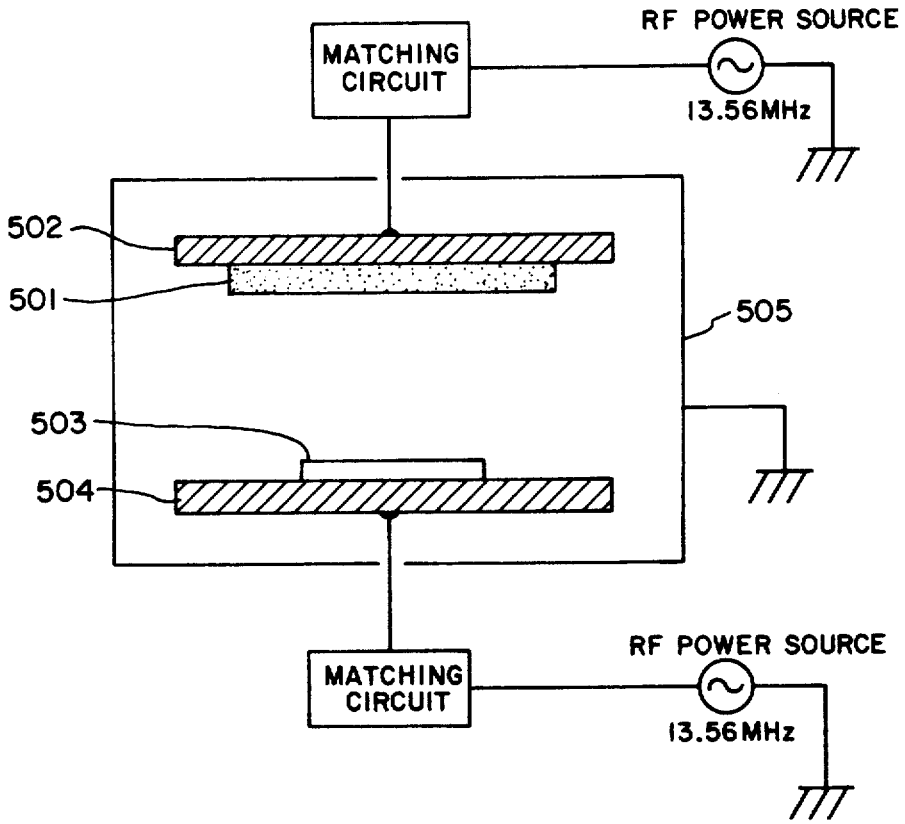
PRIOR ART FIG. 5
FIG. 5 is a schematic diagram illustrating a conventional semiconductor manufacturing apparatus.

Referring now to the drawings, wherein like reference numerals designate identical or corresponding parts throughout the several views, FIG. 1(a) illustrates a first embodiment of a bias sputtering apparatus for forming an insulating thin film according to the present invention. In FIG. 1(a), designated at 101 is a target of a material such as $SiO_2$, for example, mounted on a target electrode 102. Radiofrequency power of, for example, 13.56 MHz is applied to the target electrode via a matching circuit in the same fashion as the conventional apparatus (FIG. 5). Moreover, radiofrequency power having a higher frequency than that applied to the target, for example 100 MHz, is applied to a silicon wafer 103 and a succeptor 104 via a matching circuit.

Figure 1B:
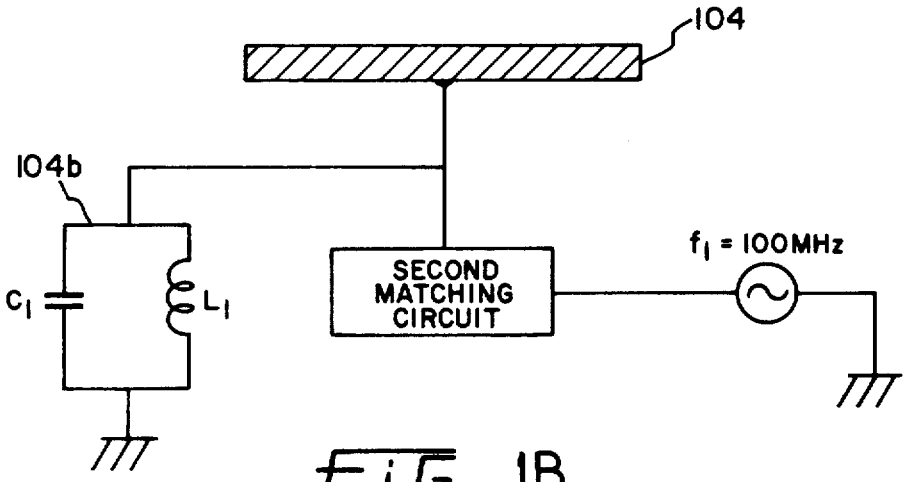
FIG. 1c is a graph illustrating the filter characteristic of a band reject filter.

In addition, band reject filters 102' and 104' are respectively provided for the target electrode 102 and the succeptor electrode 104 so as to permit only high frequencies of 13.56 MHz and 100 MHz to be supplied thereto. The band reject filters used for the succeptor electrode 104 may take an arrangement as illustrated in FIG. 1(b) for example. A parallel L-C circuit has the maximum impedance at its resonance frequency of $$f_1 = 1/(2\pi\sqrt{L_1C_1})$$

Figure 1C:
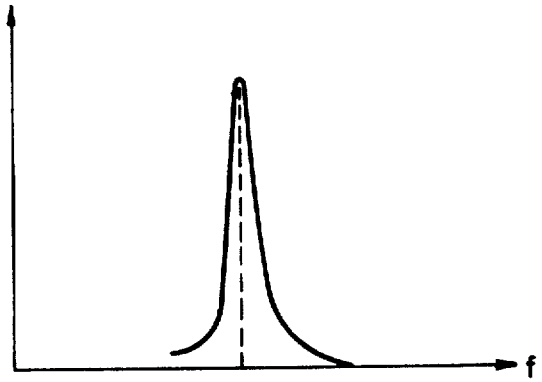

(FIG. 1(c)), and is substantially short-circuited at frequencies other than that of the resonance frequency, and hence it can select only a high frequency of a prescribed one ($f1 = 100$ MHz in the present case) to supply it to the succeptor electrode. Hereupon, the arrangement of FIG. 1(b) strictly shows the fundamental principle of the present invention, to which various modifications for improvement may be applied, as a matter of course.

Figure 1D:
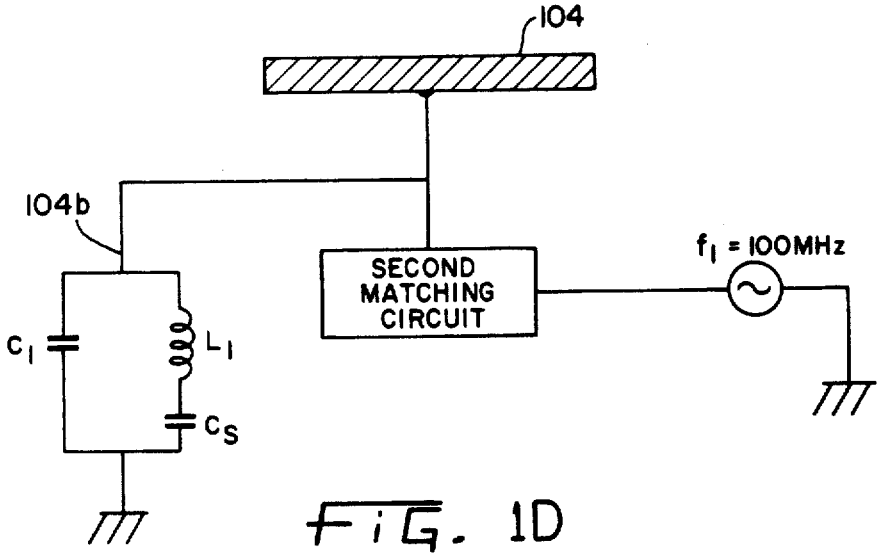

For example FIG. 1(d) shows such an improvement. In FIG. 1(d), although a circuit 104b is DC grounded, when it is desired to float the circuit, a capacitor $C_S$ may be added, like capacitor 104d in FIG. 1(d), to cut off the DC path, for example. It is needed thereupon to make $C_S$ sufficiently high such that it satisfies: to prevent shifting of the resonance frequency from $f_l$.

In this case, the $L_1$-$C_S$ series circuit is adapted to have zero impedance at the resonance frequency of $$f_o = (1/2\pi\sqrt{L_1C_s})$$

and this is short-circuited at that frequency. Provided $$f_l L_9 >> 1/f_1 C_s$$

this resonance frequency $f_o$ is set to be equal to the aforementioned frequency of 13.56 MHz applied to the target, the succeptor can effectively prevent the radiofrequency of 13.56 MHz from interfering therewith.

Again referring to FIG. 1(a), a vacuum vessel 105 is electrically grounded. In addition, a permanent magnet 106 is provided for enhancing the electrical discharge inside the vacuum vessel 105 by making use of magnetron discharge. Moreover, the apparatus includes an exhaust unit, a gas introduction mechanism, and a mechanism for taking in and out of the silicon wafer 103, which are omitted for brevity's sake.

Here, the bias sputtering apparatus of the present invention arranged as described above assures film making of an insulating thin film by bias sputtering without damaging the underlying semiconductor wafer. The reason is explained with the aid of FIGS. 2 and 3.

Figure 2:
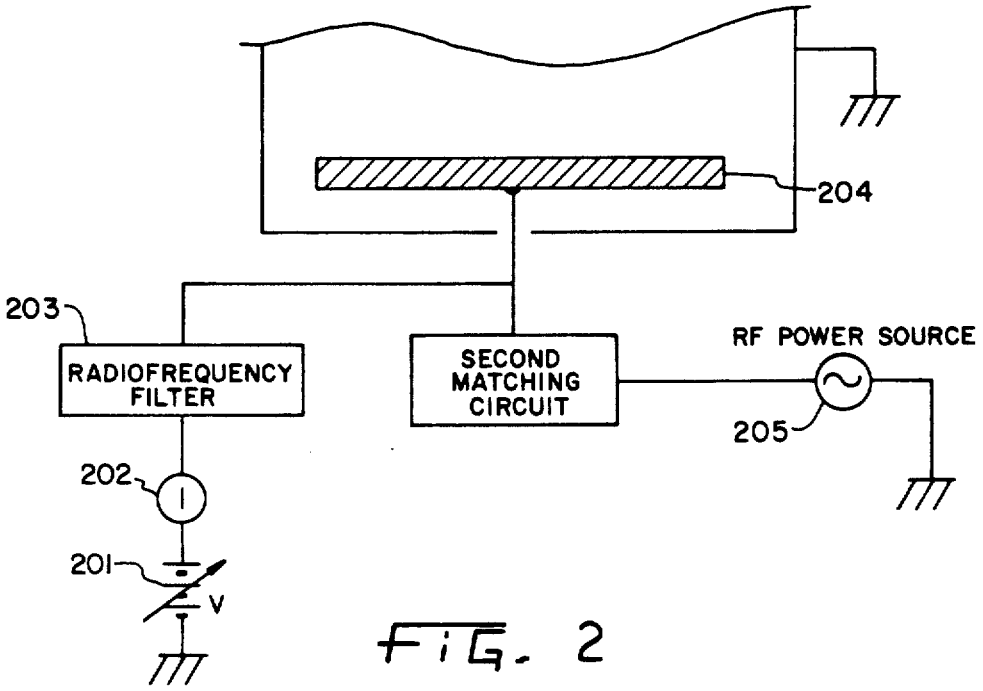
FIG. 2 is a schematic diagram illustrating a measuring unit for measuring a volt-ampere characteristic of a succeptor electrode.

FIG. 2 is a schematic diagram illustrating a device for measuring the volt-ampere characteristic of the succeptor electrode. A bias sputtering apparatus employed here is the same as that shown in FIG. 1. But, a DC power source 201 and an ammeter 202 are connected to one of the aforementioned electrodes (the succeptor electrode 204 in this figure) via a low pass filter 203 which has a high impedance at high frequency signals to be applied to the succeptor and which is substantially short-circuited for DC signals.

Figure 3:
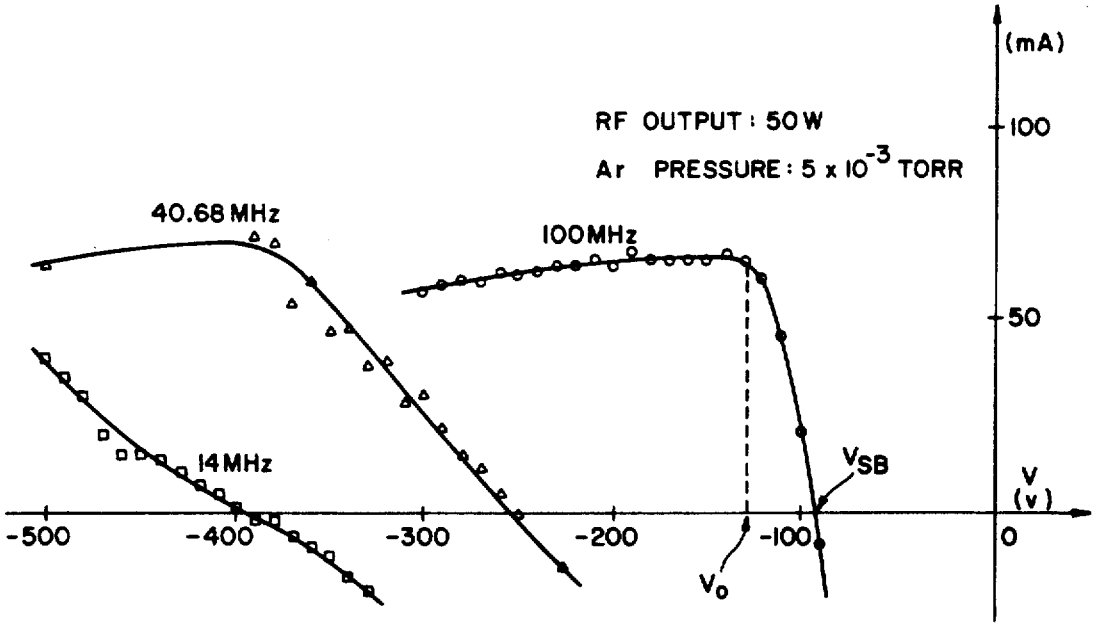
FIG. 3 is a graph illustrating experimental data concerning the volt-ampere characteristic of the succeptor electrode.

FIG. 3 is a graph plotting a relationship between DC voltage V to be applied to the succeptor electrode and a current flowing therethrough as obtained upon introduction of Ar gas at pressure of $5\times10^{-3}$ Torr into the vacuum vessel 105 to cause electrical discharge therein. Thereupon, the frequency of the radiofrequency power source 205 is made variable with results plotted in the figure for three frequencies 14 MHz, 40.68 MHz, and 100 MHz. Currents flowing into the electrode are assumed there to be positive.

For example, referring to the characteristic of 100 MHz, $I=0$ holds when V is approximately $-95$ V (this value is expressed by $v_{SB}$); $1<0$ when $V>V_{SB}$; and $I>0$ when $V<V_{SB}$. This value of $V_{SB}$ is called a self-bias which is DC bias voltage naturally appearing when the electrode is floating. That is, when the electrode has this potential, numbers of ions and electrons flowing from the plasma into the electrode are equal to and cancel out each other to result in zero current flow. The current is thereupon allowed to flow by controlling the potential of the electrode by making use of a DC bias applied from the outside. For example $V>V_{SB}$ causes many electrons to flow into the electrode to result in $1<0$.

Against this, when $V<V_{SB}$ holds, a potential barrier against the electrons is made high such that, the number of electrons flowing into the electrode is reduced, whereby the ion current is made higher to permit a positive current to flow through the electrode. With V being further increased negatively, the current is saturated at $V=V_o$ up to a constant. This is equal to the current carried only by the ions. In view of the above-described investigation, the slope of the I-V characteristic when $V>V_o$ corresponds to the width of energy distributions of those electrons. That is, a larger slope means a narrow energy distribution width. FIG. 3 clearly shows the width of the energy distribution at 100 MHz is reduced to about 1/10 of that at 14 MHz. Assuming the width of the energy distribution of the ions to be $\Delta E_{ion}$ and that of the electrons to be $\Delta E_e$, there is substantially a proportional relationship, and hence the width of the energy distribution of the ions is also reduced to about 1/10.

Furthermore, $V_{SB}$ is also reduced by ¼ or less in terms of absolute values from −400 V at 14 MHz to about −95 V at 100 MHz.

Prior methods of bias sputtering suffered as described above from the fact that the underlying substrate was damaged to deteriorate the characteristics of the resultant semiconductor device. This occurred because the electric discharge was produced at the frequency of 13.56 MHz to result in $|V_{sub}|=400$ V to 6000 V, whereby those ions accelerated by this high voltage collide against the semiconductor substrate. In addition, the energy distribution of the ions is broadened to permit many ions to have sufficiently higher energy than the mean value of the energy even if that mean value is controlled. Such high energy ions bombard, the substrate to damage the same.

However, the first embodiment of the present invention is adapted to apply a radiofrequency wave of 100 MHz to the wafer succeptor electrode 104 to reduce $|V_S|$ to about ¼ to 1/5 and to reduce $\Delta E_{ion}$ to 1/10 or less as compared with the prior case in which FR power at 13.56 MHz was used. Thus, the first embodiment of the present invention can prevent the semiconductor substrate from being damaged.

The self-bias voltage $V_{SB}$ is further reduced as the frequency of the radiofrequency power source is increased. Accordingly, such a frequency capable of providing a DC bias necessary and sufficient to effect the RF bias sputtering may be selected so as to be applied to the succeptor.

In FIG. 1(a), 13.56 MHz is applied to the target electrode 102 in the same manner as in the prior case to cause a greater self-bias for thereby promoting sputtering owning to higher ion energy, whereby the rate of sputtering for the target is prevented from being decreased. Furthermore, the embodiment of FIG. 1(a) is adapted to include a magnet 106 provided in the vacuum vessel 105 to concentrate ions produced by magnetron discharge in the vicinity of the target substrate thereby further to increase the rate of sputtering.

According to the RF bias sputtering apparatus of the present invention, as described above, the RF bias sputtering for an insulating film can be assured with the rate of film making kept higher without damaging the substrate.

Moreover, the energy of the ions entering the succeptor can be controlled by applying a DC bias to the succeptor electrode as illustrated in FIG. 2, but this is not effective in forming an insulating thin film associated with the present invention. The reason is that the surface potential of such an insulating film is fixed to $V_{SB}$ at all times independently of that of the electrode. It is therefore impossible to finely control the energy of the ions entering the substrate without any reliance on the present invention.

Although the frequencies of the RF power to be supplied to the target and the succeptor were 13.56 MHz and 100 MHz in the above description, they are not limited thereto as a matter of course. Briefly, the frequency for the latter succeptor may be made higher than that for the former target, and actual values of those frequencies may be determined in consideration of a required rate of film making and a coated shape of a formed film at the stepped portion, etc., which rely on respective particular purposes.

However, the use of a microwave power having a frequency such as 2.45 GHz, for example, undesirably causes non-uniform film thickness because the wavelength of the electromagnetic wave becomes less than the size of the wafer.

In order to make a uniform film, the RF wavelength from the RF power source for use in the RF discharge needs to be at least twice the wafer diameter or more. This frequency preferably ranges from 100 MHz to 1 GHz. But, it is needless to say that another frequency out of this range may be employed depending on the wafer diameter.

Figure 6:
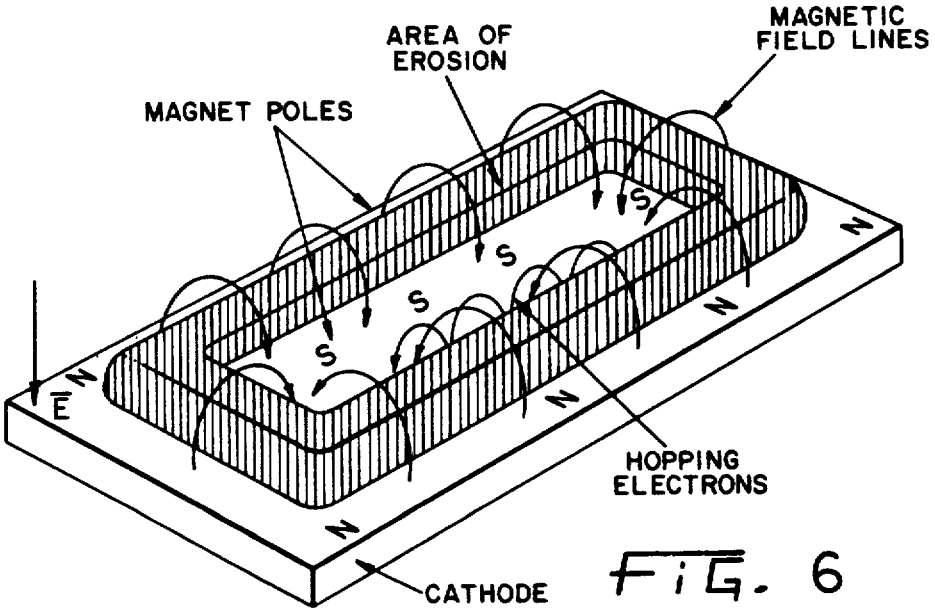
FIG. 6 is an isometric view of a powerful magnet of racing track type.
Figure 4A:
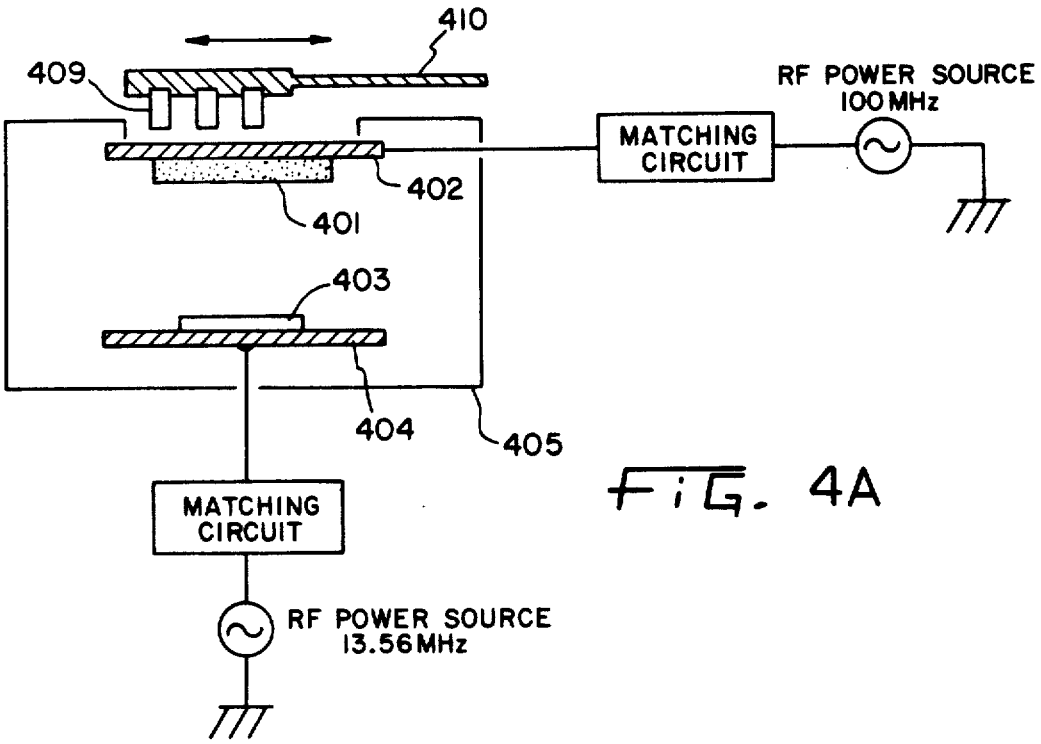
FIGS. 4(a) and 4(b) are schematic diagrams respectively illustrating second and third embodiments of the semiconductor manufacturing apparatus according to the present invention.

In addition, the magnet 106 mounted on the back of the target electrode 102 is not limited to the arrangement shown in FIG. 1. As disclosed for example in the second embodiment of the present invention shown in FIG. 4(a), a powerful magnet 409 of racing track type of which example is shown in FIG. 6 may be installed and scanned to assure a more uniform magnetic filed. Thereupon, provided a scanning system 410 is disposed outside a vacuum vessel 405 as shown in FIG. 4(a), for example, a reaction system is favorably prevented from being contaminated by any dust produced owning to mechanical operation thereof. Moreover, the magnet 106 may be omitted, of course, if necessary without departing from the scope of the present invention.

It is furthermore permitted to install a magnet also on the side of the succeptor to improve the efficiency of resputtering. In addition, the magnet employed there may be stationarily mounted such as 106 of FIG. 1, or may be movably mounted, such as the magnet 410 of FIG. 4(a).

Moreover, in order to reduce further any damage on the semiconductor substrate, the following method, for example, may also be useful. That is, in depositing an insulating film such as $SiO_2$ directly on the exposed surface of silicon, RF power supplied to the silicon substrate is first set to zero without resputtering when a first film of thickness from about several tens Å is formed, and thereafter the system is changed over to the bias sputtering. This prevents the surface of the silicon substrate from being damaged because of no resputtering occurring where the silicon surface is exposed and because of the initiation of sputtering for film making after a thin film is formed on the silicon surface.

Figure 4B:
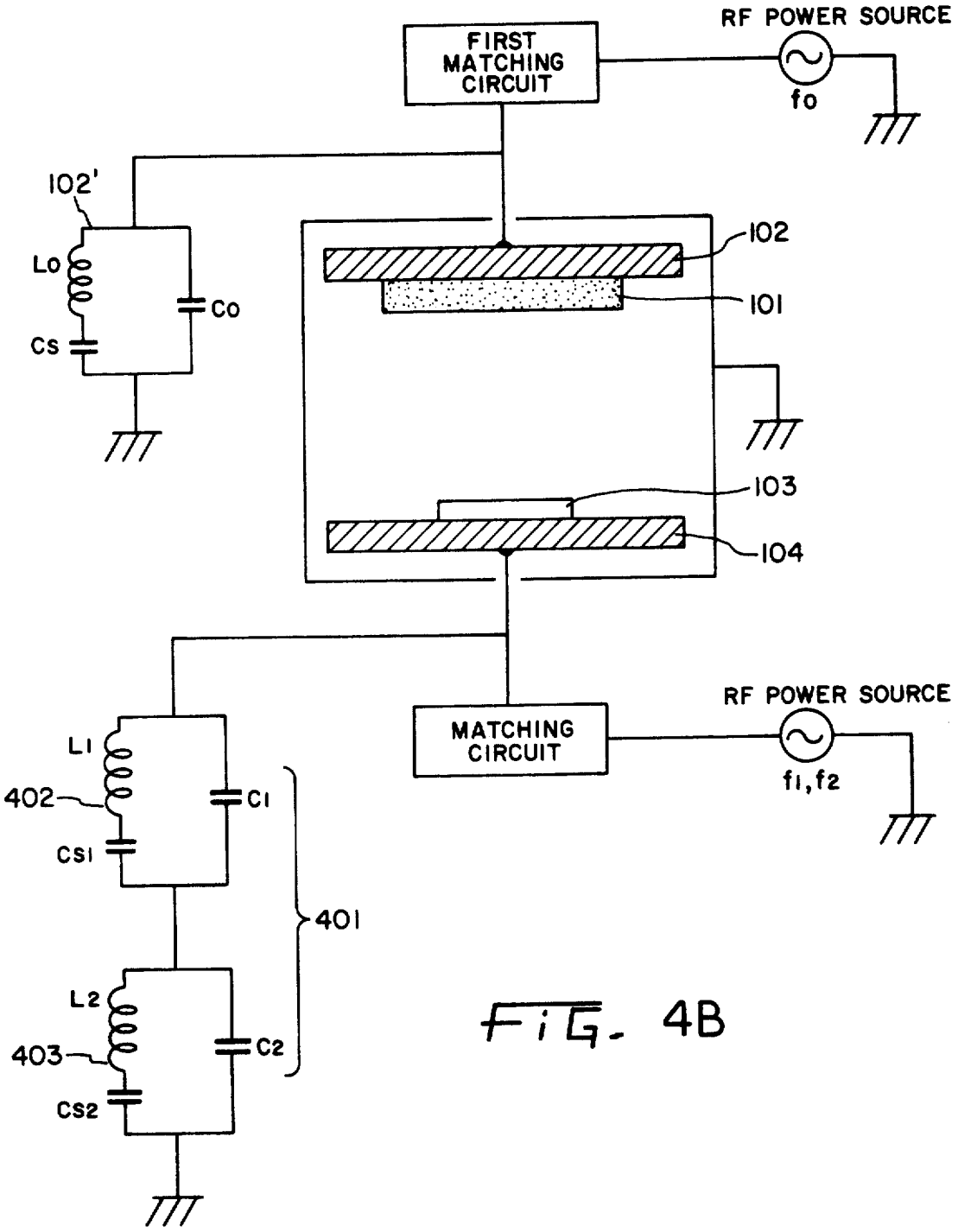

FIG. 4(b) illustrates a third embodiment of the present invention, capable of freely selecting energy for resputtering with reduced damage onto the semiconductor substrate. This is different from the first embodiment shown in FIG. 1(a) because the FIG. 4(b) embodiment is adapted to selectively apply any of two different frequencies of $f_1$ and $f_2$ to the succeptor by changeover thereof with a new band eliminator 401 for which the previous one is exchanged, depending on the frequency employed between $f_1$ and $f_2$.

Designated at 402 and 403 are respectively LC resonance circuits having resonance frequencies of $f_1$ and $f_2$.

$$f_1 = 1/(2\pi\sqrt{L_1C_1})$$

$$f_2 = 1/(2\pi\sqrt{L_1C_1})$$

A band eliminator 401 including the two resonance circuits 402 and 403 connected in series is adapted to have high impedances only at the two frequencies of $f_1$ and $f_2$ and short-circuited at frequencies other than those two frequencies, and hence serves to selectively supply only the RF waves of these two kinds to the succeptor.

For example $f_0 = 13.56$ MHz, $f_1 = 100$ MHz, and $f_2 = 40$ MHz. In addition, in depositing an insulating film such an $SiO_2$ directly on the exposed surface of silicon, for example, the RF frequency applied to the succeptor 104 is made $f_1$ (100 MHz) when a first film having the thickness of from several tens Å to 100 Å is formed. Thereafter, the frequency is changed over to $f_2$ (40 MHz) to permit a thick film (0.5 to 1 μm for example) to be formed. Such arrangement permits resputtering to be effected at a small self bias of about 95 V corresponding to 100 MHz when the silicon surface is exposed further to reduce any damage on the semiconductor substrate. The changeover of the frequency to 40 MHz upon completion of covering of the surface with $SiO_2$ to the thickness of about 100 Å increases the self-bias to 250 V and assures an enhanced effect of the resputtering. However, since the surface of the silicon has already been covered with $SiO_2$, the substrate is protected from damage.

Such a technique is particularly important in controlling the surface flatness of the insulating film deposited by the method of the bias sputtering, because such a change in the frequency enables energy of the Ar ions to be controlled for the most effective resputtering and the optimum energy to be selected without fear of damage to the substrate.

Although here only the case of the two different frequencies of $f_1$ and $f_2$ were described, three frequencies of $f_1$, $f_2$ and $f_3$ may be employed as a matter of course. But, in this situation, for a frequency $f_1$ to be first applied to th e electrode, it is important that $f_1$ have a frequency higher than $f_2$ and $f_3$ to prevent damage to the substrate. In addition, upon the use of a plurality of frequencies, it is desirous to select those frequencies, $f_1$, $f_2$ . . . including the frequency $f_0$ for the target such that they do not satisfy a relationship of higher harmonics with respect to each other, because a nonlinear discharge space may cause RF waves of harmonic frequencies $f_0$, $f_1$, $f_2$ . . . to interfere with each other depending on the discharge conditions to result in inaccurate settlement of a desired condition.

Although the embodiments of the present invention are mainly illustrated for the disposition of the $SiO_2$film in the foregoing description, they are not limited thereto as a matter of course. For example, the present invention may be applied to film making from materials such as PSG, BPSG, nitrided silicon, $Al_2O_3$, and AlN, etc.

In addition, although the present invention is described by exemplary application to the technique of RF bias sputtering with use of Ar ions, it is also applicable to reactive RF bias sputtering wherein upon making of a film of $Si_3N_4$ for example, a Si substrate is employed as the target with $N_2$ or $NH_3$ employed as the introduction gas to make a film of $Si_3N_4$. In making a film of AlN, Al may be employed as the target substrate together with $N_2$ or $NH_3$ as the introduction gas.

Moreover, the present invention is applicable as needed to the formation of macromolecular materials such as polyimide films and resists, for example.

Furthermore, it is a matter of course that the substrate for use in film making is not limited to the semiconductor wafer.

According to the semiconductor manufacturing apparatus of the present invention, as described above, a high quality insulating film excellent in surface flatness can be manufactured with ease without causing any damage onto the substrate.

Obviously, numerous additional modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A [semiconductor] manufacturing apparatus for depositing [an insulating] *a* thin film on the surface of a [semiconductor] substrate in a vacuum vessel at an atmosphere of reduced pressure, comprising:

a target composed of a material for said [insulating] thin film or of at least one of constituent elements of said material for the [insulating] thin film;

wherein the [semiconductor] substrate is adapted to be disposed spaced apart from the target in a confronting relation therewith for permitting the [insulating] film of the target to be deposited thereon;

a first radiofrequency power source for generating first radiofrequency power of a first frequency for application to the target;

a succeptor electrode adapted to support the [semiconductor] substrate thereon;

a second radiofrequency power source for generating second radiofrequency power of a second frequency for application to the succeptor electrode; and said first frequency being selected to be lower than said second frequency.

2. A semiconductor manufacturing apparatus according to claim [1] *13*, comprising, a target electrode provided adjoining said target and mounted on the target for applying first radio-frequency power of the first frequency to said target;

a first matching circuit provided between said target electrode and said first radiofrequency power source for matching the target electrode to said first radiofrequency power source;

a first band reject filter disposed between the matching circuit and the target electrode for selectively permitting only the first radiofrequency power to be transmitted to the target electrode;

a second matching circuit disposed between the succeptor electrode and the second radiofrequency power source for matching the succeptor electrode to the second radiofrequency power source; and a second band reject filter disposed between the succeptor electrode and the matching circuit for selectively permitting only the second radiofrequency power to be transmitted to the succeptor electrode.

3. A semiconductor manufacturing apparatus according to claim 2, wherein said first frequency is 13.56 MHz while said second frequency is not less than 100 MHz.

4. A semiconductor manufacturing apparatus according to claim 2, wherein said second band reject filter used for said succeptor electrode comprises:

a parallel L-C circuit presenting a maximum impedance at a resonance frequency of $$F1 = 1/(2\pi\sqrt{L_1C_1}),$$

where $L_1$ is the inductance of an inductor L and $C_1$ is the capacitance of a capacitor C connected in parallel with the inductor L.

5. A semiconductor manufacturing apparatus according to claim 2, comprising:

permanent magnets in said vacuum vessel for use in magnetron discharge effected in the vicinity of the semiconductor substrate for promoting the rate of sputtering.

6. A semiconductor manufacturing apparatus according to claim 2, wherein said second radiofrequency power source for use in the radiofrequency discharge provides a radiofrequency having a wavelength at least twice the size of the semiconductor substrate for assuring uniform film making.

7. A semiconductor manufacturing apparatus according to claim [2] *5*, wherein said magnet for magnetron discharge comprises an elongated closed loop magnet.

8. A semiconductor manufacturing apparatus according to claim 2, comprising:

magnets provided on the side of the semiconductor substrate for improving the efficiency of the resputtering.

9. A semiconductor manufacturing apparatus according to claim 2, wherein the second radiofrequency power source comprises:

means for generating and applying to the succeptor powers of two different frequencies $f_1$ and $f_2$, said frequency $f_1$ being higher than said frequency $f_2$, said frequency $f_1$ being changed over to $f_2$, wherein radiofrequency power of said frequency $f_1$ is first applied to said succeptor electrode in making a thin film, and thereafter said radiofrequency of said frequency $f_2$ is applied to form a further thick film on said thin film.

10. A semiconductor manufacturing apparatus according to claim 2, wherein said succeptor electrode has a plurality of radiofrequency powers of a plurality of different radiofrequencies corresponding to said powers applied from a plurality of the radiofrequency power sources thereto for reducing any damage on the substrate, the radiofrequency power first applied to the succeptor having a radiofrequency higher than the radiofrequencies of the other power sources.

11. A semiconductor manufacturing apparatus according to claim 10, wherein said plurality of radiofrequencies are selected so that not one of said plurality of radiofrequencies is an integer multiple of the radiofrequency of another radiofrequency in order to avoid nonlinear interaction among said plurality of radiofrequencies.

12. A semiconductor manufacturing apparatus according to claim 2, wherein said insulating thin film of the target is a material selected from the group consisting of $SiO_2$, BPSG, silicon nitride, $Al_2O_3$, and AlN.

*13. A manufacturing apparatus according to claim 1, wherein said substrate is a semiconductor substrate, and wherein said thin film is an insulating thin film.*

* * * * *